United States Patent
Sills et al.

(10) Patent No.: US 11,063,037 B2
(45) Date of Patent: Jul. 13, 2021

(54) DEVICES, MEMORY DEVICES, AND ELECTRONIC SYSTEMS

(71) Applicant: Micron Technology, Inc., Boise, ID (US)

(72) Inventors: Scott E. Sills, Boise, ID (US); Kurt D. Beigel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/737,472

(22) Filed: Jan. 8, 2020

(65) Prior Publication Data

US 2020/0144252 A1 May 7, 2020

Related U.S. Application Data

(63) Continuation of application No. 16/443,628, filed on Jun. 17, 2019, which is a continuation of application (Continued)

(51) Int. Cl.
*G11C 5/02* (2006.01)
*H01L 27/06* (2006.01)
(Continued)

(52) U.S. Cl.
CPC .......... *H01L 27/0688* (2013.01); *G11C 5/025* (2013.01); *G11C 29/42* (2013.01);
(Continued)

(58) Field of Classification Search
CPC .................. G11C 16/0408; G11C 16/0416
See application file for complete search history.

(56) References Cited

U.S. PATENT DOCUMENTS

| 4,740,826 A | 4/1988 | Chatterjee |
| 5,038,325 A | 8/1991 | Douglas et al. |

(Continued)

FOREIGN PATENT DOCUMENTS

| CN | 101431078 B | 4/2010 |
| CN | 101150132 B | 12/2011 |

(Continued)

OTHER PUBLICATIONS

Bonnaud et al., Verticasl Channel Thin Film Transistor: Improvement Approach Similar to Multigate Monolithic CMOS Technology, ECS Transactions, vol. 37, vol. 1, (2011), pp. 29-37.

(Continued)

*Primary Examiner* — Tuan T Nguyen
(74) *Attorney, Agent, or Firm* — TraskBritt

(57) ABSTRACT

A semiconductor device comprises a stack structure comprising decks each comprising a memory element level comprising memory elements, and a control logic level in electrical communication with the memory element level and comprising control logic devices. At least one of the control logic devices of the control logic level of one or more of the decks comprises at least one device exhibiting transistors laterally displaced from one another. A memory device, a thin film transistor control logic assembly, an electronic system, and a method of operating a semiconductor device are also described.

18 Claims, 10 Drawing Sheets

Related U.S. Application Data

No. 15/858,229, filed on Dec. 29, 2017, now Pat. No. 10,340,267.

(51) Int. Cl.

| | | |
|---|---|---|
| *H01L 29/78* | (2006.01) | |
| *H01L 29/423* | (2006.01) | |
| *H01L 29/10* | (2006.01) | |
| *H01L 29/08* | (2006.01) | |
| *H01L 27/092* | (2006.01) | |
| *H01L 27/12* | (2006.01) | |
| *H01L 27/105* | (2006.01) | |
| *G11C 29/42* | (2006.01) | |
| *H01L 27/24* | (2006.01) | |
| *G11C 29/00* | (2006.01) | |
| *G11C 8/10* | (2006.01) | |
| *G11C 29/44* | (2006.01) | |
| *G11C 29/12* | (2006.01) | |
| *G11C 5/14* | (2006.01) | |
| *G11C 7/06* | (2006.01) | |
| *G11C 7/10* | (2006.01) | |
| *G11C 8/08* | (2006.01) | |
| *H03K 19/0948* | (2006.01) | |
| *H03K 19/20* | (2006.01) | |

(52) U.S. Cl.
CPC .......... *G11C 29/76* (2013.01); *H01L 27/0924* (2013.01); *H01L 27/1052* (2013.01); *H01L 27/1214* (2013.01); *H01L 27/24* (2013.01); *H01L 29/0847* (2013.01); *H01L 29/1033* (2013.01); *H01L 29/42356* (2013.01); *H01L 29/42392* (2013.01); *H01L 29/7827* (2013.01); *G11C 5/14* (2013.01); *G11C 7/06* (2013.01); *G11C 7/10* (2013.01); *G11C 8/08* (2013.01); *G11C 8/10* (2013.01); *G11C 29/1201* (2013.01); *G11C 29/44* (2013.01); *G11C 2029/1202* (2013.01); *G11C 2029/1204* (2013.01); *H01L 27/092* (2013.01); *H03K 19/0948* (2013.01); *H03K 19/20* (2013.01)

(56) References Cited

U.S. PATENT DOCUMENTS

| | | |
|---|---|---|
| 5,521,860 A | 5/1996 | Ohkubo |
| 5,561,622 A * | 10/1996 | Berlin .................. G11C 5/06 257/686 |
| 5,612,563 A | 3/1997 | Fitch et al. |
| 6,094,068 A | 7/2000 | Nomura et al. |
| 6,252,427 B1 | 6/2001 | Domae et al. |
| 6,349,399 B1 | 2/2002 | Manning |
| 6,424,001 B1 | 7/2002 | Forbes et al. |
| 6,691,252 B2 | 2/2004 | Hughes et al. |
| 6,721,206 B2 | 4/2004 | Abedifard |
| 6,774,426 B2 | 8/2004 | Abedifard |
| 6,924,560 B2 | 8/2005 | Wang et al. |
| 7,265,393 B2 | 9/2007 | Schuele et al. |
| 7,372,091 B2 | 5/2008 | Leslie |
| 7,408,224 B2 | 8/2008 | Kim |
| 7,629,633 B2 | 12/2009 | Chan et al. |
| 7,825,460 B2 | 11/2010 | Breitwisch et al. |
| 8,294,212 B2 | 10/2012 | Wang et al. |
| 8,958,228 B2 | 2/2015 | Samachisa et al. |
| 9,105,320 B2 | 8/2015 | Schubert et al. |
| 9,112,138 B2 | 8/2015 | Ramaswamy et al. |
| 9,281,044 B2 | 3/2016 | Ramaswamy et al. |
| 9,530,790 B1 | 12/2016 | Lu et al. |
| 9,653,617 B2 | 5/2017 | Zhou et al. |
| 9,792,987 B1 | 10/2017 | Chou et al. |
| 10,297,290 B1 | 5/2019 | Beigel et al. |
| 10,366,983 B2 | 7/2019 | Beigel et al. |
| 2003/0038318 A1 * | 2/2003 | Forbes .............. G11C 16/0408 257/331 |
| 2006/0049461 A1 | 3/2006 | Schuele et al. |
| 2006/0097304 A1 | 5/2006 | Yoon |
| 2009/0057722 A1 | 3/2009 | Masuoka et al. |
| 2009/0114971 A1 | 5/2009 | Cai et al. |
| 2009/0213639 A1 | 8/2009 | Toda |
| 2010/0142294 A1 * | 6/2010 | Carman ................ G11C 11/404 365/191 |
| 2010/0213525 A1 | 8/2010 | Masuoka et al. |
| 2010/0219483 A1 | 9/2010 | Fujio et al. |
| 2011/0089975 A1 | 4/2011 | Yamazaki et al. |
| 2012/0239861 A1 * | 9/2012 | Lee .................... G11C 11/5628 711/103 |
| 2013/0003433 A1 | 1/2013 | Hishida et al. |
| 2013/0044545 A1 * | 2/2013 | Jeong ..................... G11C 16/10 365/185.17 |
| 2013/0234101 A1 | 9/2013 | Sasago et al. |
| 2013/0234240 A1 | 9/2013 | Moon et al. |
| 2014/0151776 A1 | 6/2014 | Beigel et al. |
| 2014/0361239 A1 | 12/2014 | Ramaswamy et al. |
| 2015/0131381 A1 | 5/2015 | Rhie |
| 2016/0019951 A1 * | 1/2016 | Park ...................... G11C 5/025 365/148 |
| 2016/0035418 A1 | 2/2016 | Castro et al. |
| 2016/0155855 A1 | 6/2016 | Ramaswamy et al. |
| 2016/0240533 A1 | 8/2016 | Oxland |
| 2016/0343727 A1 | 11/2016 | Kim et al. |
| 2016/0351722 A1 | 12/2016 | Zhou et al. |
| 2016/0364331 A1 | 12/2016 | Lee et al. |
| 2017/0287560 A1 * | 10/2017 | Park ................... G11C 16/3427 |
| 2018/0034831 A1 | 2/2018 | Zhang |
| 2018/0039784 A1 | 2/2018 | Hung et al. |
| 2018/0040370 A1 | 2/2018 | Tortorelli et al. |
| 2018/0047753 A1 | 2/2018 | Yamazaki et al. |
| 2018/0061835 A1 | 3/2018 | Yang et al. |
| 2018/0308853 A1 | 10/2018 | Bell et al. |
| 2018/0330798 A1 | 11/2018 | You |
| 2018/0342584 A1 | 11/2018 | Boemmels |
| 2018/0374541 A1 * | 12/2018 | Jung .................... G11C 16/10 |
| 2019/0043594 A1 | 2/2019 | Zhao et al. |
| 2019/0156884 A1 | 5/2019 | Redaelli et al. |
| 2019/0206449 A1 | 7/2019 | Beigel et al. |

FOREIGN PATENT DOCUMENTS

| | | |
|---|---|---|
| CN | 107112049 A | 8/2017 |
| JP | 2000-311952 A | 11/2000 |
| KR | 10-2013-0103942 A | 9/2013 |

OTHER PUBLICATIONS

Chan et al., Amorphous Silicon Thin-Film Transistors with 90° Vertical Nanoscale Channel, Appl. Phys. Lett, vol. 86, (2005), pp. 253501-1-253501-3.
Fairchild Semiconductor, CMOS, The Ideal Logic Family, Application Note 77, (Jan. 1983), 12 pages.
International Search Report from International Application No. PCT/US2018/067736, dated Apr. 29, 2019, 3 pages.
International Written Opinion from International Application No. PCT/US2018/067736, dated Apr. 29, 2019, 7 pages.
ITRS, International Technology Roadmap for Semiconductors, 2013 Edition, Process Integration, Devices, and Structures, 51 pages.
Li et al., Skybridge-3D-CMOS: A Fine-Grained 3D CMOS Integrated Circuit Technology, IEEE Transactions on Nanotechnology, vol. 16, No. 4, (Jul. 2017), pp. 639-652.
Michal, Vratislav, On the Low-Power Design, Stability Improvement and Frequency Estimation of the CMOS Ring Oscillator, Radioelektronika (Radioelektronika), 2012 22nd International Conference, Apr. 17-18, 2012, 4 pages.
Nelson et al, Defeating the Trade-Off Between Process Complexity and Electrical Performance with Vertical Zinc Oxide Transistors, Appl. Phys. Lett, vol. 101, (2012), pp. 183503-1-183503-4.
Yakimets et al, Vertical GAAFETs for the Ultimate CMOS Scaling, IEEE Transactions on Electron Devices, vol. 26, No. 5, (May 2015), pp. 1433-1439.

(56) References Cited

OTHER PUBLICATIONS

Zhao et al, Three-Dimensional Flexible Complementary Metal-Oxide-Semiconductor Logic Circuits Based on Two-Layer Stacks of Single-Walled Carbon Nanotube Networks, ACS Nano, vol. 10, (2016), pp. 2193-2202.
Chinese First Office Action with Search Report for Application No. 201880084643.5, dated Apr. 15, 2021, 20 pages.

* cited by examiner

DEVICES, MEMORY DEVICES, AND ELECTRONIC SYSTEMS

CROSS-REFERENCE TO RELATED APPLICATION

This application is a continuation of U.S. patent application Ser. No. 16/443,628, filed Jun. 17, 2019, now U.S. Pat. No. 10,643,991, issued May 5, 2020, which is a continuation of application Ser. No. 15/858,229, filed Dec. 29, 2017, now U.S. Pat. No. 10,340,267, issued Jul. 2, 2019, the disclosure of each of which is hereby incorporated herein in its entirety by this reference.

TECHNICAL FIELD

Embodiments of the disclosure relate to the field of semiconductor device design and fabrication. More specifically, embodiments of the present disclosure relate to semiconductor devices including stack structures having control logic levels in decks thereof, and to related memory devices, control logic assemblies, electronic systems, and methods of operating a semiconductor device.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many types of memory including, but not limited to, random-access memory (RAM), read-only memory (ROM), dynamic random access memory (DRAM), synchronous dynamic random access memory (SDRAM), Flash memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) on the memory cells of the memory device. An assembly of the control logic devices may be provided in electrical communication with the memory cells of the memory array by way of routing and interconnect structures. However, as the number of decks of a 3D memory array increases, electrically connecting the memory cells of the different decks of the 3D memory array to the assembly of control logic devices within the base control logic structure can create sizing and spacing complications associated with the increased quantities and dimensions of routing and interconnect structures required to facilitate the electrical connection. In addition, the quantities, dimensions, and arrangements of the different control logic devices employed within the base control logic structure can also undesirably impede reductions to the size of a memory device, increases to the storage density of the memory device, and/or reductions in fabrication costs.

It would, therefore, be desirable to have improved semiconductor devices, control logic assemblies, and control logic devices facilitating higher packing densities, as well as methods of forming the semiconductor devices, control logic assemblies, and control logic devices.

DETAILED DESCRIPTION

Figure 1:
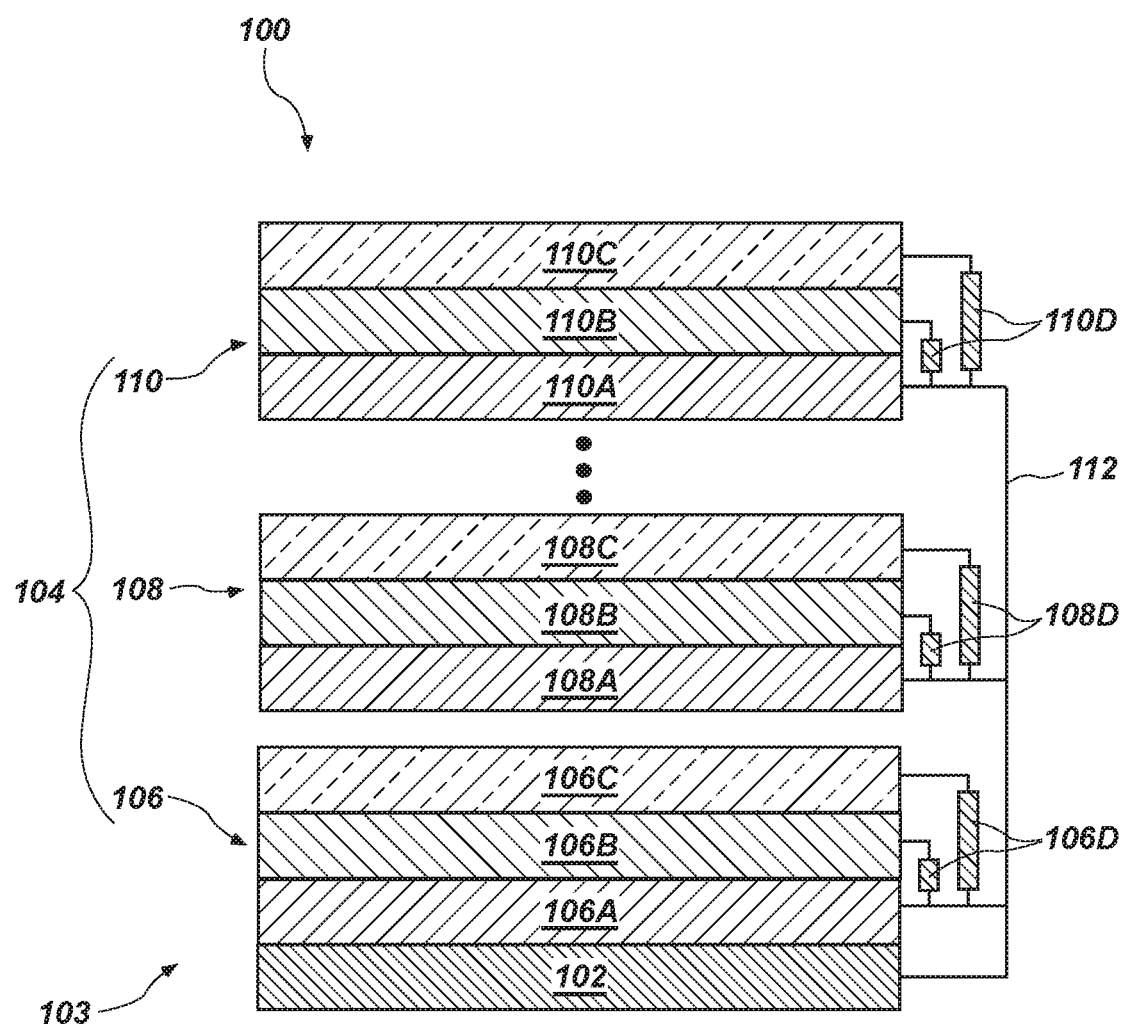
FIG. 1 is a simplified side elevation view of a semiconductor device, in accordance with embodiments of the disclosure.

Semiconductor devices including stack structures having control logic levels in decks thereof are described, as are memory devices, control logic assemblies, electronic systems, and methods of operating a semiconductor device. In some embodiments, a semiconductor device includes a stack structure including multiple decks (e.g., tiers) each individually including a control logic level (e.g., a TFT control logic level), an access device level on or over the control logic level, and a memory element level on or over the access device level. The control logic level of each individual deck of the stack structure is in electrical communication with the access device level and the memory element level of the individual deck. The control logic level of each individual deck of the stack structure may also be in electrical communication with a base control logic structure of the semiconductor device. The control logic level of each of the decks of the stack structure includes control logic devices and circuitry for controlling different operations of the memory element level and the access device level associated therewith. The control logic devices and circuitry included in the control logic level of each of the decks of the stack structure are different than additional control logic devices and circuitry included in the base control logic structure of the semiconductor device. The additional control logic devices and circuitry included in the base control logic structure work in conjunction with the control logic devices and circuitry included in the control logic level of each of the decks of the stack structure to facilitate desired operations (e.g., access operations, read operations, write operations) of the semiconductor device. In addition, the control logic devices included in the control logic level of at least one deck of the stack structure include at least one device including transistors (e.g., vertical transistors, horizontal transistors, fin field-effect transistors (FinFETs)) laterally (e.g., horizontally) displaced (e.g., spaced apart, separated) from one another. The devices, structures, assemblies, systems, and methods of the disclosure may facilitate increased efficiency, performance, simplicity, and durability in semiconductor devices (e.g., 3D memory devices) that rely on high packing density.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, at least 99.9% met, or even 100.0% met.

As used herein, the term "about" in reference to a given parameter is inclusive of the stated value and has the meaning dictated by the context (e.g., it includes the degree of error associated with measurement of the given parameter).

As used herein, the term "NMOS" transistor means and includes a so-called metal-oxide transistor having a P-type channel region. The gate of the NMOS transistor may comprise a conductive metal, another conductive material, such as polysilicon, or a combination thereof. As used herein, the term "PMOS" transistor means and includes a so-called metal-oxide transistor having an N-type channel region. The gate of the PMOS transistor may comprise a conductive metal, another conductive material, such as polysilicon, or a combination thereof. Accordingly, the gate structures of such transistors may include conductive materials that are not necessarily metals.

FIG. 1 shows a simplified side elevation view of a semiconductor device 100 (e.g., a 3D memory device), in accordance with embodiments of the disclosure. As shown in FIG. 1, the semiconductor device 100 includes a base control logic structure 102, and a stack structure 103 overlying the base control logic structure 102. As described in further detail below, the stack structure 103 includes decks 104 (e.g., tiers) each individually including a thin film transistor (TFT) control logic level, an access device level over the TFT control logic level, a memory element level over the access device level, and interconnect structures extending between the TFT control logic level and each of the access device level and the memory element level. Each TFT control logic level of the decks 104 may individually include one or more control logic devices (e.g., CMOS devices) exhibiting neighboring, laterally displaced transistors (e.g., NMOS transistors, PMOS transistors), as also described in further detail below. The base control logic structure 102 is in electrical communication with one or more (e.g., each) of the decks 104 of the stack structure 103 by way of interconnect structures 112 extending between the base control logic structure 102 and one or more levels (e.g., the TFT control logic level) of the one or more decks 104 of the stack structure 103.

The base control logic structure 102 may include devices and circuitry for controlling various operations of the stack structure 103. The devices and circuitry included in the base control logic structure 102 may be selected relative to devices and circuitry included in the TFT control logic levels of the decks 104 of the stack structure 103. The devices and circuitry included in the base control logic structure 102 may be different than the devices and circuitry included in the TFT control logic levels of the decks 104 of the stack structure 103, and may be used and shared by different decks 104 of the stack structure 103 to facilitate desired operation of the stack structure 103. By way of non-limiting example, the base control logic structure 102 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{dd}$) regulators, and various chip/deck control circuitry. The devices and circuitry included in the base control logic structure 102 may employ different conventional CMOS devices (e.g., conventional CMOS inverters, conventional CMOS NAND gates, conventional CMOS transmission pass gates, etc.), which are not described in detail herein. In turn, as described in further detail below, the devices and circuitry included in the TFT control logic level of each of the decks 104 of the stack structure 103 may not be shared by different decks 104 of the stack structure 103, and may be dedicated to effectuating and controlling various operations (e.g., access device level operations, and memory element level operations) of the deck 104 associated therewith not encompassed within the functions of the devices and circuitry included in the base control logic structure 102.

With continued reference to FIG. 1, the stack structure 103 may include any desired number of the decks 104. For clarity and ease of understanding of the drawings and related description, FIG. 1 shows the stack structure 103 as including three (3) decks 104. A first deck 106 may include a first TFT control logic level 106A, a first access device level 106B on or over the first TFT control logic level 106A, a first memory element level 106C on or over the first access device level 106B, and first interconnect structures 106D extending between and electrically coupling the first TFT control logic level 106A to each of the first access device level 106B and the first memory element level 106C. A second deck 108 may overlie the first deck 106 and may include a second TFT control logic level 108A, a second access device level 108B on or over the second TFT control logic level 108A, a second memory element level 108C on or over the second access device level 108B, and second interconnect structures 108D extending between and electrically coupling the second TFT control logic level 108A to each of the second access device level 108B and the second memory element level 108C. A third deck 110 may overlie the second deck 108 and may include a third TFT control logic level 110A, a third access device level 110B on or over the third TFT control logic level 110A, a third memory element level 110C on or over the third access device level 110B, and third interconnect structures 110D extending between and electrically coupling the third TFT control logic level 110A to each of the third access device level 110B and the third memory element level 110C. In additional embodiments, the stack structure 103 includes a different number of decks 104. For example, the stack structure 103 may include greater than three (3) decks 104 (e.g., greater than or equal to four (4) decks 104, greater than or equal to eight (8) decks 104, greater than or equal to sixteen (16) decks 104, greater than or equal to thirty-two (32) decks 104, greater than or equal to sixty-four (64) decks 104), or may include less than three (3) decks 104 (e.g., two (2) decks 104).

The memory element levels (e.g., the first memory element level 106C, the second memory element level 108C, the third memory element level 110C) of the each of the decks 104 (e.g., the first deck 106, the second deck 108, the third deck 110) of the stack structure 103 may each individually include an array of memory elements. The array may, for example, include rows of the memory elements extending in a first lateral direction, and columns of the memory elements extending in a second lateral direction perpendicular to the first lateral direction. In additional embodiments, the array may include a different arrangement of the memory elements, such as hexagonal close packed arrangement of the memory elements. The memory elements of the array may comprise RAM elements, ROM elements, DRAM elements, SDRAM elements, Flash memory elements, resistance variable memory elements, or another type of memory element. In some embodiments, the memory elements comprise DRAM elements. In additional embodiments, the memory elements comprise resistance variable memory elements. Non-limiting examples of resistance variable memory elements include ReRAM elements, conductive bridge RAM elements, MRAM elements, PCM memory elements, PCRAM elements, STTRAM elements, oxygen vacancy-based memory elements, and programmable conductor memory elements.

The access device levels (e.g., the first access device level 106B, the second access device level 108B, the third access device level 110B) of the each of the decks 104 (e.g., the first deck 106, the second deck 108, the third deck 110) of the stack structure 103 may each individually include an array of access devices (e.g., TFT access devices). The access devices of the access device level (e.g., the first access device level 106B, the second access device level 108B, the third access device level 110B) of a given deck 104 (e.g., the first deck 106, the second deck 108, the third deck 110) may be operatively associated with the memory elements of the memory element level (e.g., the first memory element level 106C, the second memory element level 108C, the third memory element level 110C) of the given deck 104. The quantity and lateral positioning of the access devices of the access device level of the given deck 104 may, for example, correspond to the quantity and lateral positioning of the memory elements of the memory element level of the given deck 104. The access devices of the access device level may underlie (or overlie) and be in electrical communication with the memory elements of the memory element level. Together the access devices of the access device level and the memory elements of the memory element level operatively associated therewith may form memory cells for each of the decks 104 of the stack structure 103. The access devices may, for example, each individually include a channel region between a pair of source/drain regions, and a gate configured to electrically connect the source/drain regions to one another through the channel region. The access devices may comprise planar access devices (e.g., planar TFT access devices) or vertical access devices (e.g., vertical TFT access devices). Planar access devices can be distinguished from vertical access devices based upon the direction of current flow between the source and drain regions thereof. Current flow between the source and drain regions of a vertical access device is primarily substantially orthogonal (e.g., perpendicular) to a primary (e.g., major) surface of a substrate or base (e.g., the base control logic structure 102) thereunder, and current flow between source and drain regions of a planar access device is primarily parallel to the primary surface of the substrate or base thereunder. In additional embodiments, the access device levels (e.g., the first access device level 106B, the second access device level 108B, the third access device level 110B) are omitted (e.g., absent) from the decks 104 (e.g., the first deck 106, the second deck 108, the third deck 110) of the stack structure 103. For example, in place of the access device levels separate from the memory element levels (e.g., the first memory element level 106C, the second memory element level 108C, the third memory element level 110C), each of the decks 104 of the stack structure 103 may include a single (e.g., only one) level including memory elements and access devices.

The TFT control logic levels (e.g., the first TFT control logic level 106A, the second TFT control logic level 108A, the third TFT control logic level 110A) of the each of the decks 104 (e.g., the first deck 106, the second deck 108, the third deck 110) of the stack structure 103 may include devices and circuitry for controlling various operations of the memory element level (e.g., the first memory element level 106C, the second memory element level 108C, the third memory element level 110C) and the access device level (e.g., the first access device level 106B, the second access device level 108B, the third access device level 110B) (or of a single level including memory elements and access devices) of the deck 104 not encompassed (e.g., effectuated, carried out, covered) by the devices and circuitry of the base control logic structure 102. By way of non-limiting example, the TFT control logic levels may each individually include one or more (e.g., each) of decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), word line (WL) drivers, repair circuitry (e.g., column repair circuitry, row repair circuitry), I/O devices (e.g., local I/O devices), test devices, array multiplexers (MUX), error checking and correction (ECC) devices, and self-refresh/wear leveling devices. As described in further detail below, the devices and circuitry included in the TFT control logic levels may employ TFT CMOS devices including laterally displaced transistors (e.g., PMOS transistors, NMOS transistors). The devices and circuitry of the TFT control logic level of each of the decks 104 may only be utilized to effectuate and control operations within a single (e.g., only one) deck 104 of the stack structure 103 (e.g., may not be shared between two or more of the decks 104), or may be utilized to effectuate and control operations within multiple (e.g., more than one) decks 104 of the stack structure 103 (e.g., may be shared between two or more of the decks 104). In addition, each of the TFT control logic levels (e.g., the first TFT control logic level 106A, the second TFT control logic level 108A, and the third TFT control logic level 110A) of the stack structure 103 may exhibit substantially the same configuration (e.g., substantially the same components and component arrangements), or at least one of the TFT control logic levels of the stack structure 103 may exhibit a different configuration (e.g., different components and/or a different component arrangement) than at least one other of the TFT control logic levels.

Thus, a semiconductor device according to embodiments of the disclosure comprises a stack structure comprising decks each comprising a memory element level comprising memory elements, and a control logic level in electrical communication with the memory element level and comprising control logic devices. At least one of the control logic devices of the control logic level of one or more of the decks comprises at least one least one device exhibiting transistors laterally displaced from one another.

Figure 2:
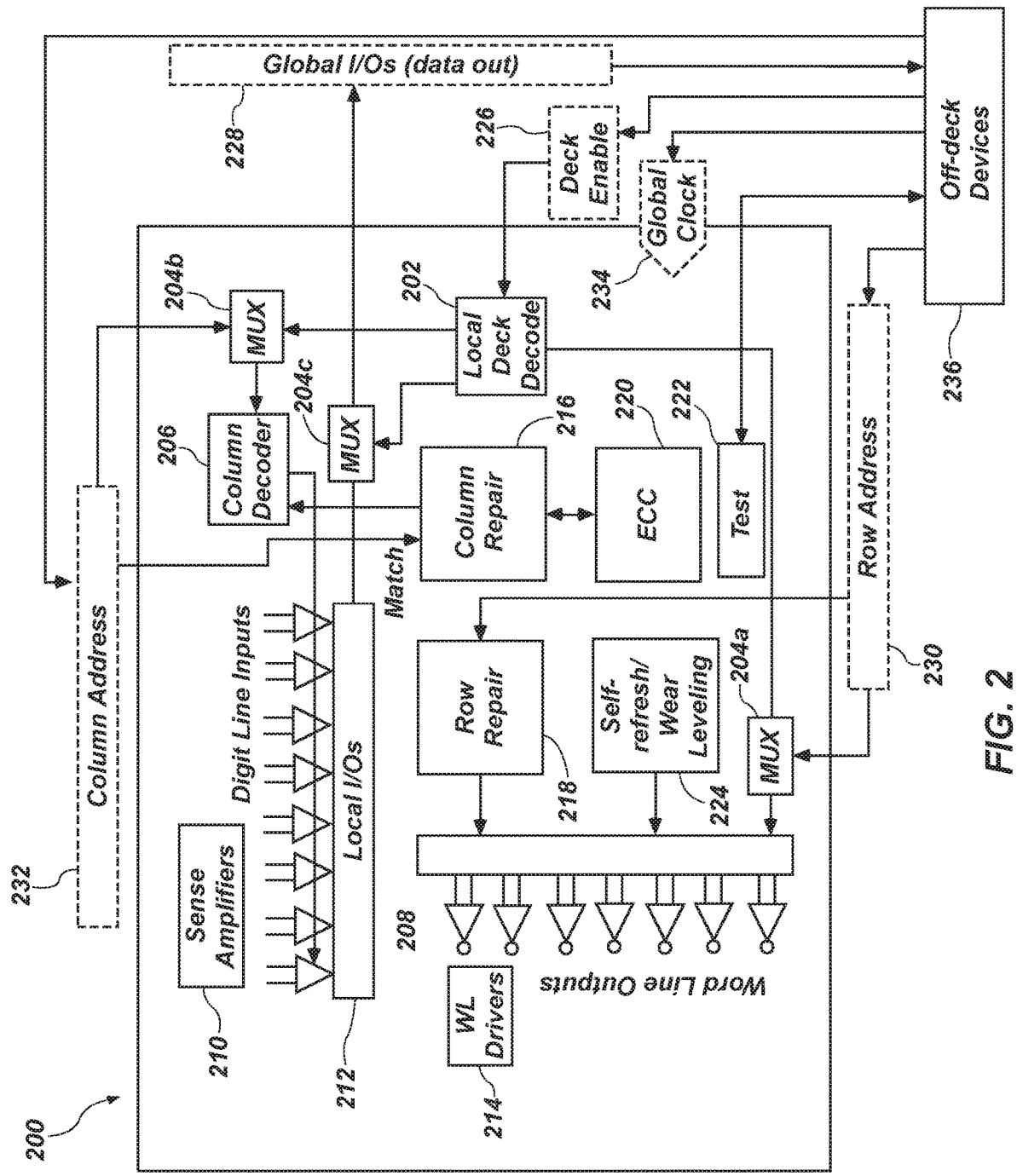
FIG. 2 is a block diagram of a thin film transistor (TFT) control logic level of the semiconductor device shown in FIG. 1, in accordance with embodiments of the disclosure.

FIG. 2 is a block diagram of a configuration of a TFT control logic level 200 for use in one or more of the decks 104 (FIG. 1) of the stack structure 103 (FIG. 1) of the semiconductor device 100 shown in FIG. 1. The TFT control logic level 200 may include a variety of control logic devices and circuits that would otherwise be included in off-deck circuitry (e.g., circuitry not presented within the TFT control logic level 200), such as circuitry within a base control logic structure (e.g., the base control logic structure 102 shown in FIG. 1). For example, as shown in FIG. 2, an assembly of control logic devices and circuits present within the TFT control logic level 200 may include one or more (e.g., each) of a local deck decoder 202, multiplexers (MUX) 204 (illustrated in FIG. 2 as a first MUX 204a, second MUX 204b, and a third MUX 204c), a column decoder 206, a row decoder 208, sense amplifiers 210, local I/O devices 212, word line (WL) drivers 214, a column repair device 216, a row repair device 218, a memory test device 222, an ECC device 220, and a self-refresh/wear leveling device 224. One or more of the control logic devices and circuits may exhibit laterally-displaced transistors (e.g., laterally-displaced vertical transistors, laterally-displaced horizontal transistors, laterally-displaced FinFETs), as described in further detail below. The assembly of control logic devices and circuits present within the TFT control logic level 200 may be operatively associated with (e.g., in electrical communication with) off-deck devices 236 (e.g., a controller, a host, global I/O devices) located outside of the TFT control logic level 200, such as within the base control logic structure 102 shown in FIG. 1. The off-deck devices 236 may send a variety of signals to the TFT control logic level 200, such as a deck enable signal 226, a row address signal 230, a column address signal 232, a global clock signal 234; and may also receive a variety of signals from the TFT control logic level 200, such as a global data signal 228. While FIG. 2 depicts a particular configuration of the TFT control logic level 200, one of ordinary skill in the art will appreciate that different control logic assembly configurations, including different control logic devices and circuits and/or different arrangements of control logic devices and circuits, are known in the art which may be adapted to be employed in embodiments of the disclosure. FIG. 2 illustrates just one non-limiting example of the TFT control logic level 200.

Thus, in accordance with embodiments of the disclosure, a method of operating a semiconductor device comprises controlling functions of a stack structure having multiple decks each comprising memory cells using control logic levels of the multiple decks. The control logic levels each comprise at least one control logic device exhibiting laterally-displaced transistors. Additional functions of the stack structure are controlled using a base control logic structure in electrical communication with the control logic levels of the stack structure.

As shown in FIG. 2, one or more off-deck devices 236 located outside of the TFT control logic level 200 (e.g., in the base control logic structure 102 shown in FIG. 1) may be configured and operated to convey signals (e.g., a deck enable signal 226, a row address signal 230, a column address signal 232) to different devices of the TFT control logic level 200. For example, the off-deck devices 236 may send a deck enable signal 226 to the local deck decoder 202, which may decode the deck enable signal 226 and activate one or more of the MUX 204 (e.g., the first MUX 204a, the second MUX 204b, and/or the third MUX 204c) of the TFT control logic level 200. As described in further detail below, when activated, the MUX 204 may individually be configured and operated to select one of several input signals and then forward the selected input into a single line.

The local deck decoder 202 of the TFT control logic level 200 may be configured and operated to receive activation (e.g., trigger) signals from a deck enable signal 226 and communicate with the off-deck devices 236 to generate control signals, which are then directed to one or more of the MUX 204 (e.g., the first MUX 204a, the second MUX 204b, and/or the third MUX 204c) of the TFT control logic level 200 to activate and/or deactivate the one or more of the MUX 204. When activated, the MUX 204 may individually be configured and operated to select one of several input signals, and then forward the selected input into a single line.

The first MUX 204a (e.g., a row MUX) of the TFT control logic level 200 may be in electrical communication with the local deck decoder 202 and the row decoder 208 of the TFT control logic level 200. The first MUX 204a may be activated by signal(s) from the local deck decoder 202, and may be configured and operated to selectively forward at least one row address signal 230 from the off-deck devices 236 to the row decoder 208. The row decoder 208 may be configured and operated to select particular word lines of a deck (e.g., one of the first deck 106, the second deck 108, and the third deck 110 shown in FIG. 1) including the TFT control logic level 200 based on the row address signal 230 received thereby.

With continued reference to FIG. 2, the row repair device 218 of the TFT control logic level 200 may be in electrical communication with the row decoder 208, and may be configured and operated to substitute a defective row of memory elements of a memory element array of a memory element level (e.g., one of the memory element levels 106C, 108C, 110C shown in FIG. 1) operatively associated with (e.g., within the same deck 104 shown in FIG. 1) the TFT control logic level 200 for a spare, non-defective row of memory elements of the memory element array of the memory element level. The row repair device 218 may transform a row address signal 230 directed to the row decoder 208 (e.g., from the first MUX 204a) identifying the defective row of memory elements into another row address signal identifying the spare, non-defective row of memory elements. Defective rows (and columns) of memory elements may, for example, be determined using the memory test device 222 of the TFT control logic level 200, as described in further detail below.

The WL drivers 214 of the TFT control logic level 200 may be in electrical communication with the row decoder 208, and may be configured and operated to activate word lines of a deck (e.g., one of the first deck 106, the second deck 108, and the third deck 110 shown in FIG. 1) including the TFT control logic level 200 based on word line selection commands received from the row decoder 208. The memory elements of a memory element level (e.g., one of the memory element levels 106C, 108C, 110C shown in FIG. 1) operatively associated with the TFT control logic level 200 may be accessed by way of access devices of an access device level (e.g., one of the access device levels 106B, 108B, 110B shown in FIG. 1) operatively associated with the TFT control logic level 200 for reading or programming by voltages placed on the word lines using the WL drivers 214.

The self-refresh/wear leveling device 224 of the TFT control logic level 200 may be in electrical communication with the row decoder 208, and may be configured and operated to periodically recharge the data stored in memory elements of a memory element level (e.g., one of the memory element levels 106C, 108C, 110C shown in FIG. 1) operatively associated with (e.g., within the same deck 104 shown in FIG. 1) the TFT control logic level 200. During a self-refresh/wear leveling operation, the self-refresh/wear leveling device 224 may be activated in response to an external command signal, and may generate different row address signals that may be forwarded to the row decoder 208. The row decoder 208 may then select particular word lines of a deck (e.g., one of the first deck 106, the second deck 108, and the third deck 110 shown in FIG. 1) including the TFT control logic level 200 based on the different row address signals received from the self-refresh/wear leveling device 224. The row decoder 208 may then communicate with the WL drivers 214 to activate the selected word lines, and charges accumulated in capacitors of memory elements operatively associated with the selected word lines may then be amplified by a sense amplifier and then stored in the capacitors again.

Still referring to FIG. 2, the second MUX 204b (e.g., a column MUX) of the TFT control logic level 200 may be in electrical communication with the local deck decoder 202 and the column decoder 206 of the TFT control logic level 200. The second MUX 204b may be activated by signal(s) from the local deck decoder 202, and may be configured and operated to selectively forward at least one column address signal 232 from the off-deck devices 236 to the column decoder 206. The column decoder 206 may be configured and operated to select particular digit lines (e.g., bit lines) of a deck (e.g., one of the first deck 106, the second deck 108, and the third deck 110 shown in FIG. 1) including the TFT control logic level 200 based on the column address selection signal received thereby.

The column repair device 216 of the TFT control logic level 200 may be in electrical communication with the column decoder 206, and may be configured and operated to substitute a defective column of memory elements of a memory element array of a memory element level (e.g., one of the memory element levels 106C, 108C, 110C shown in FIG. 1) operatively associated with (e.g., within the same deck 104 shown in FIG. 1) the TFT control logic level 200 for a spare, non-defective column of memory elements of the memory element array of the memory element level. The column repair device 216 may transform a column address signal 232 directed to the column decoder 206 (e.g., from the second MUX 204b) identifying the defective column of memory elements into another column address signal identifying the spare, non-defective column of memory elements. As previously discussed, defective columns (and rows) of memory elements may, for example, be determined using the memory test device 222 of the TFT control logic level 200, as described in further detail below.

The ECC device 220 of the TFT control logic level 200 may be configured and operated to generate an ECC code (also known as "check bits"). The ECC code may correspond to a particular data value, and may be stored along with the data value in a memory element of a memory element level (e.g., one of the memory element levels 106C, 108C, 110C shown in FIG. 1) operatively associated with (e.g., within the same deck 104 shown in FIG. 1) the TFT control logic level 200. When the data value is read back from the memory element, another ECC code is generated and compared with the previously-generated ECC code to access the memory element. If non-zero, the difference in the previously-generated ECC code and the newly-generated ECC code indicates that an error has occurred. If an error condition is detected, the ECC device 220 may then be utilized to correct the erroneous data.

The memory test device 222 of the TFT control logic level 200 may be configured and operated to identify defective (e.g., faulty) memory elements of a memory element array of a memory element level (e.g., one of the memory element levels 106C, 108C, 110C shown in FIG. 1) operatively associated with (e.g., within the same deck 104 shown in FIG. 1) the TFT control logic level 200. The memory test device 222 may attempt to access and write test data to memory elements at different addresses (e.g., different column addresses, different row addresses) within the memory element array. The memory test device 222 may then attempt to read data stored at the memory elements, and compare the read data to the test data expected at the memory elements. If the read data is different than the expected test data, the memory test device 222 may identify the memory elements as defective. The defective memory elements (e.g., defective rows of memory elements, defective columns of memory elements) identified by the memory test device 222 may then be acted upon and/or avoided by other components (e.g., the row repair device 218, the column repair device 216) of the TFT control logic level 200.

With continued reference to FIG. 2, the local I/O devices 212 of the TFT control logic level 200 may be configured and operated to receive data from digit lines selected by the column decoder 206 during read operations, and to output data to digit lines selected by the column decoder 206 during write operations. As shown in FIG. 2, the local I/O devices 212 may include sense amplifiers 210 configured and operated to receive digit line inputs from the digit lines selected by the column decoder 206 and to generate digital data values during read operations. During write operations, the local I/O devices 212 may program data into memory elements of a memory element level operatively associated with the TFT control logic level 200 by placing proper voltages on the digit lines selected by the column decoder 206. For binary operation, one voltage level is typically placed on a digit line to represent a binary "1" and another voltage level to represent a binary "0".

The third MUX 204c of the TFT control logic level 200 may be in electrical communication with the local I/O devices 212 and the local deck decoder 202. The third MUX 204c may be activated by signal(s) received from the local deck decoder 202, and may be configured and operated to receive digital data values generated by the local I/O devices 212 and to generate a global data signal 228 therefrom. The global data signal 228 may be forwarded to one or more off-deck devices 236 (e.g., a controller).

In accordance with embodiments of the disclosure, one or more of the components (e.g., one or more of the local deck decoder 202, the MUX 204 (the first MUX 204a, the second MUX 204b, the third MUX 204c), the column decoder 206, the row decoder 208, the sense amplifiers 210, the local I/O devices 212, the WL drivers 214, the column repair device 216, the row repair device 218, the ECC device 220, the memory test device 222, the self-refresh/wear leveling device 224) of the TFT control logic level 200 may employ one or more TFT CMOS devices including horizontally-neighboring transistors (e.g., horizontally-neighboring NMOS and PMOS transistors) thereof. The horizontally-neighboring transistors may comprise vertical transistors (e.g., vertical NMOS transistor(s), vertical PMOS transistor(s)) exhibiting channels vertically extending between vertically-displaced source and drain regions, or may comprise horizontal transistors (e.g., horizontal NMOS transistor(s), horizontal PMOS transistor(s)) exhibiting channels horizontally extending between horizontally displaced source and drain regions Accordingly, one or more components of at least one of the TFT control logic levels (e.g., the first TFT control logic level 106A, the second TFT control logic level 108A, the third TFT control logic level 110A) of one or more of the decks 104 (e.g., the first deck 106, the second deck 108, the third deck 110) of the stack structure 103 of the semiconductor device 100 previously described with reference to FIG. 1 may include one or more TFT CMOS devices including at least one NMOS transistor (e.g., a vertical NMOS transistor, a horizontal NMOS transistor, an NMOS fin field-effect transistor (FinFET)) horizontally-neighboring at least one PMOS transistor (e.g., a vertical PMOS transistor, a horizontal PMOS transistor, a PMOS FinFET). Non-limiting examples of such TFT CMOS devices are described in further detail below with reference to FIGS. 3A through 5.

Thus, a thin film transistor control logic assembly according to embodiments of the disclosure comprises control logic devices selected from the group comprising decoders, sense amplifiers, word line drivers, repair devices, memory test devices, multiplexers, error checking and correction devices, and self-refresh/wear leveling devices. At least one of the control logic devices comprises at least one device exhibiting a transistor having an N-type channel region laterally displaced from a transistor having a P-type channel region.

Figure 3A:
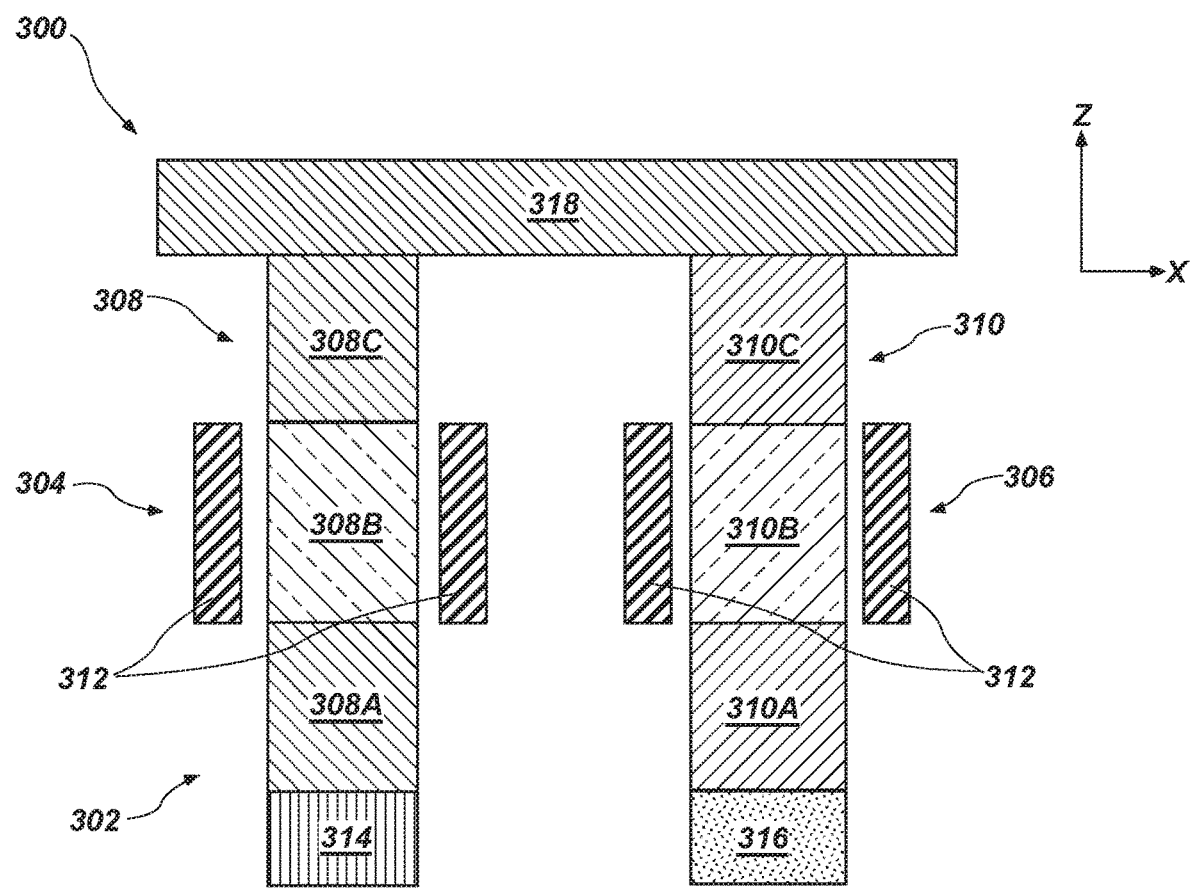
FIGS. 3A through 3C are a simplified cross-sectional views of different CMOS inverters including vertical transistors laterally displaced from one another, in accordance with embodiments of the disclosure.

FIG. 3A shows a simplified cross-sectional view of a CMOS inverter 300, in accordance with embodiments of the disclosure. The CMOS inverter 300 includes a CMOS circuit 302 comprising a vertical NMOS transistor 304, and a vertical PMOS transistor 306 horizontally displaced from the vertical NMOS transistor 304. The vertical NMOS transistor 304 includes a first semiconductive pillar 308 including an N-type source region 308A, an N-type drain region 308C, and a P-type channel region 308B vertically between the N-type source region 308A and the N-type drain region 308C. The vertical PMOS transistor 306 includes a second semiconductive pillar 310 including a P-type source region 310A, a P-type drain region 310C, and an N-type channel region 310B vertically between the P-type source region 310A and the P-type drain region 310C. The vertical NMOS transistor 304 and the vertical PMOS transistor 306 of the CMOS circuit 302 also include gate electrodes 312 horizontally adjacent the respective channel regions (e.g., the P-type channel region 308B, the N-type channel region 310B) thereof. In addition, the CMOS inverter 300 includes a ground (GND) structure 314 connected to the N-type source region 308A of the vertical NMOS transistor 304; a supply voltage ($V_{cc}$) structure 316 connected to the P-type source region 310A of vertical PMOS transistor 306; an output structure 318 connected to the N-type drain region 308C of the vertical NMOS transistor 304 and the P-type drain region 310C of the vertical PMOS transistor 306; and an input structure connected to each of the gate electrodes 312.

The gate electrodes 312 may each individually be formed of and include electrically conductive material including, but not limited to, a metal (e.g., tungsten, titanium, nickel, platinum, gold), a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), or combinations thereof. By way of non-limiting example, the gate electrodes 312 may each individually comprise at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental aluminum (Al), elemental copper (Cu), elemental iridium (Ir), iridium oxide (IrO$_x$), elemental ruthenium (Ru), ruthenium oxide (RuO$_x$), alloys thereof, or combinations thereof. In some embodiments, the gate electrodes 312 are formed of TiN.

As shown in FIG. 3A, the vertical NMOS transistor 304 may include one of the gate electrodes 312 laterally adjacent a side of the P-type channel region 308B thereof opposing another side laterally adjacent another of the gate electrodes 312; and the vertical PMOS transistor 306 may include an additional one of the gate electrodes 312 laterally adjacent a side of the N-type channel region 310B opposing another side laterally adjacent yet another of the gate electrodes 312. The gate electrodes 312 may be unshared by the vertical NMOS transistor 304 and the vertical PMOS transistor 306. Each of the vertical NMOS transistor 304 and the vertical PMOS transistor 306 may be considered to be "double-gated" in that two of the gate electrodes 312 are disposed laterally adjacent two opposing sides of the P-type channel region 308B of the vertical NMOS transistor 304; and two other of the gate electrodes 312 are disposed laterally adjacent two opposing sides of the N-type channel region 310B of the vertical PMOS transistor 306.

Figure 3B:
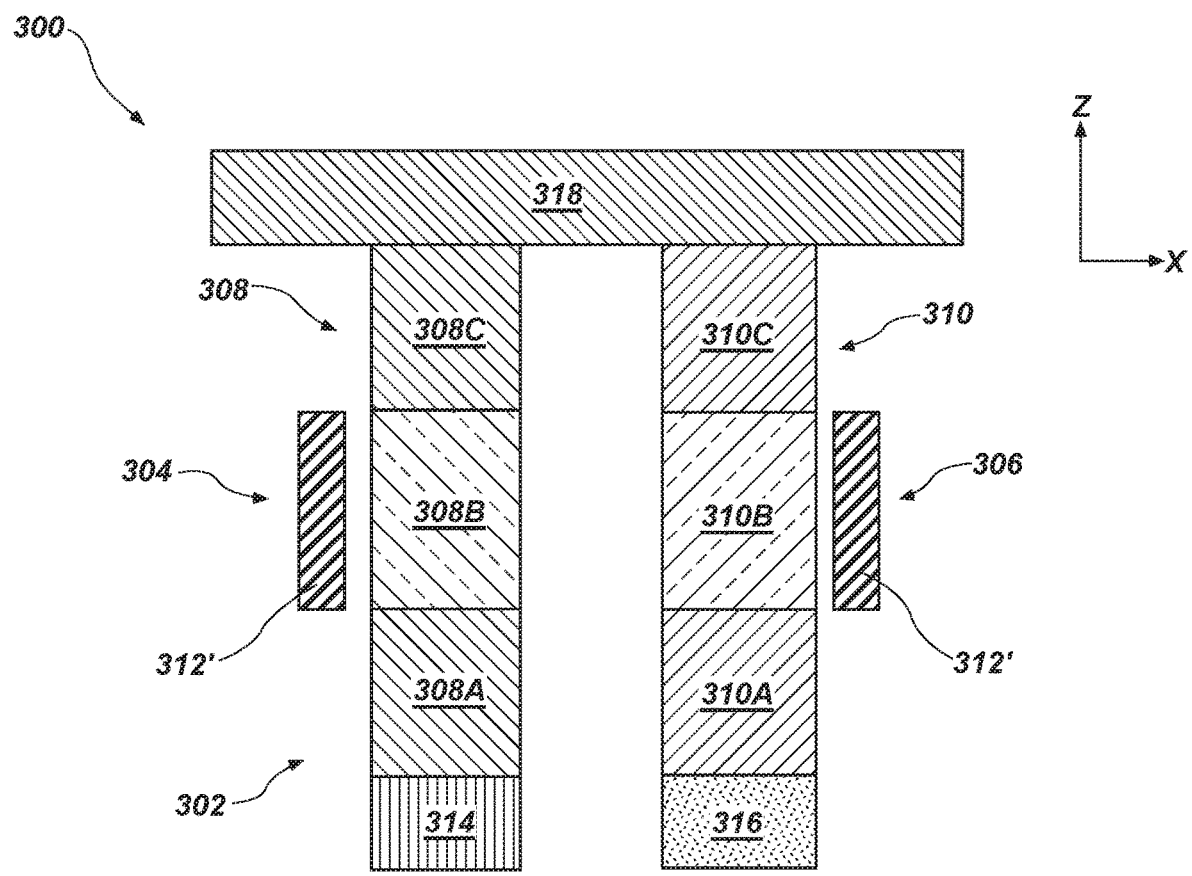
Figure 3C:
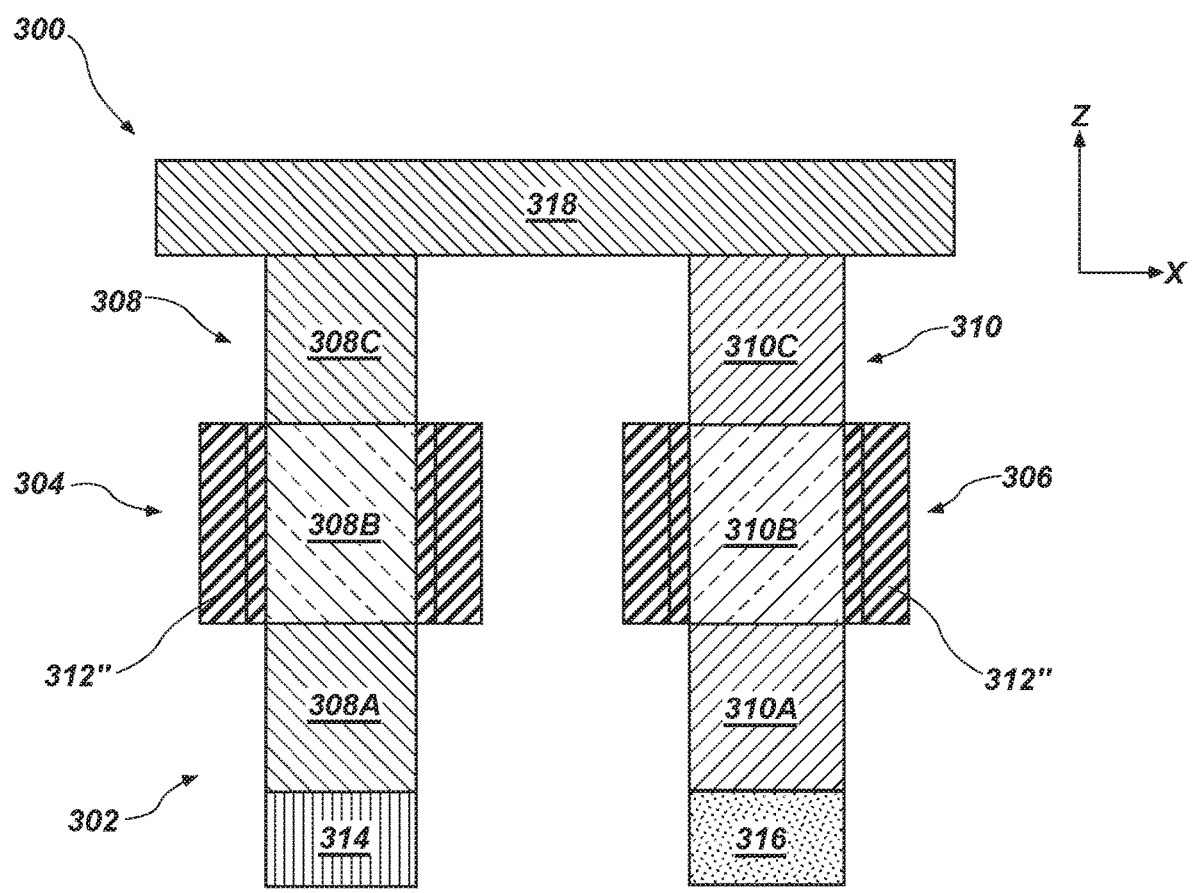

In additional embodiments, one or more of the vertical NMOS transistor 304 and the vertical PMOS transistor 306 of the CMOS circuit 302 exhibit(s) a different gate configurations than that depicted in FIG. 3A. At least one (e.g., each) of the vertical NMOS transistor 304 and the vertical PMOS transistor 306 may, for example, exhibit a gate configuration other than a "double-gate" configuration. As a non-limiting example, in accordance with additional embodiments of the disclosure, FIG. 3B shows a simplified cross-sectional view of the CMOS inverter 300, wherein the vertical NMOS transistor 304 and the vertical PMOS transistor 306 of the CMOS circuit 302 each exhibit a "single-gate" configuration. As shown in FIG. 3B, only one gate electrode 312' may be disposed laterally adjacent the P-type channel region 308B of the vertical NMOS transistor 304; and only one other gate electrode 312' may be disposed laterally adjacent the N-type channel region 310B of the vertical PMOS transistor 306. Put another way, only one side of the P-type channel region 308B of the vertical NMOS transistor 304 may have a gate electrode 312' laterally adjacent thereto; and only one side of the N-type channel region 310B of the vertical PMOS transistor 306 may have a gate electrode 312' laterally adjacent thereto. The gate electrodes 312' may have material compositions substantially similar to those previously described with respect to the gate electrodes 312 (FIG. 3A). As another non-limiting example, in accordance with future embodiments of the disclosure, FIG. 3C shows a simplified cross-sectional view of the CMOS inverter 300, wherein the vertical NMOS transistor 304 and the vertical PMOS transistor 306 of the CMOS circuit 302 each exhibit a "gate-all-around" configuration. One gate electrode 312" may substantially laterally surround all sides of the P-type channel region 308B (e.g., four sides if the P-type channel region 308B exhibits a rectangular cross-sectional shape) of the vertical NMOS transistor 304; and another gate electrode 312" may substantially laterally surround all sides of the N-type channel region 310B (e.g., four sides if the N-type channel region 310B exhibits a rectangular cross-sectional shape) of the vertical PMOS transistor 306. The gate electrodes 312" may have material compositions substantially similar to those previously described with respect to the gate electrodes 312 (FIG. 3A).

With returned reference to FIG. 3A, the P-type channel region 308B of the vertical NMOS transistor 304 may be formed of and include at least one P-type conductivity material. The P-type conductivity material may, for example, comprise polysilicon doped with at least one P-type dopant (e.g., boron ions). The P-type channel region 308B of the vertical NMOS transistor 304 may comprise a solid P-type conductivity material substantially completely filling the entire volume thereof; or the P-type channel region 308B of the vertical NMOS transistor 304 may include an opening (e.g., a hollow, a void, a space) extending through the P-type conductivity material thereof, such that the P-type channel region 308B exhibits a "hollow-channel" configuration. In addition, the N-type source region 308A and the N-type drain region 308C of the vertical NMOS transistor 304 may each individually be formed of and include at least one N-type conductivity material. The N-type conductivity material may, for example, comprise polysilicon doped with at least one N-type dopant (e.g., arsenic ions, phosphorous ions, antimony ions). The first semiconductive pillar 308 including the N-type source region 308A, the P-type channel region 308B, and the N-type drain region 308C may exhibit any desired dimensions (e.g., channel width, channel thickness, channel length) and shape (e.g., a rectangular column shape, a cylindrical column shape, a combination thereof). By way of non-limiting example, a channel thickness (laterally extending in the X-direction) of the first semiconductive pillar 308 may be within a range of from about 10 nanometers (nm) to about 50 nm, a channel width (laterally extending perpendicular to the channel thickness) of the first semiconductive pillar 308 may be within a range of from 20 nm to about 200 nm, and a channel length (vertically extending in the Z-direction) of the first semiconductive pillar 308 may be within a range of from about 50 nm to about 200 nm.

The N-type channel region 310B of the vertical PMOS transistor 306 may be formed of and include at least one N-type conductivity material. The N-type conductivity material may, for example, comprise polysilicon doped with at least one N-type dopant (e.g., arsenic ions, phosphorous ions, antimony ions). The N-type channel region 310B of the vertical PMOS transistor 306 may comprise a solid N-type conductivity material substantially completely filling the entire volume thereof; or the N-type channel region 310B of the vertical PMOS transistor 306 may include an opening (e.g., a hollow, a void, a space) extending through the N-type conductivity material thereof, such that the N-type channel region 310B exhibits a "hollow-channel" configuration. In addition, the P-type source region 310A and the P-type drain region 310C of the vertical PMOS transistor 306 may each individually be formed of and include at least one P-type conductivity material. The P-type conductivity material may, for example, comprise polysilicon doped with at least one P-type dopant (e.g., boron ions). The second semiconductive pillar 310 including the P-type source region 310A, the N-type channel region 310B, and the P-type drain region 310C may exhibit any desired dimensions (e.g., channel width, channel thickness, channel length) and shape (e.g., a rectangular column shape, a cylindrical column shape, a combination thereof). By way of non-limiting example, a channel thickness (laterally extending in the X-direction) of the second semiconductive pillar 310 may be within a range of from about 10 nanometers (nm) to about 50 nm, a channel width (laterally extending perpendicular to the channel thickness) of the second semiconductive pillar 310 may be within a range of from 20 nm to about 200 Jim, and a channel length (vertically extending in the Z-direction) of the second semiconductive pillar 310 may be within a range of from about 50 nm to about 200 nm. The dimensions of the second semiconductive pillar 310 may be substantially the same as or different than the dimensions of the first semiconductive pillar 308.

The GND structure 314, the $V_{cc}$ structure 316, the output structure 318, and the input structure of the CMOS inverter 300 may exhibit conventional configurations (e.g., conventional dimensions, conventional shapes, conventional conductive material compositions, conventional material distributions, conventional orientations, conventional arrangements), which are not described in detail herein.

Figure 4A:
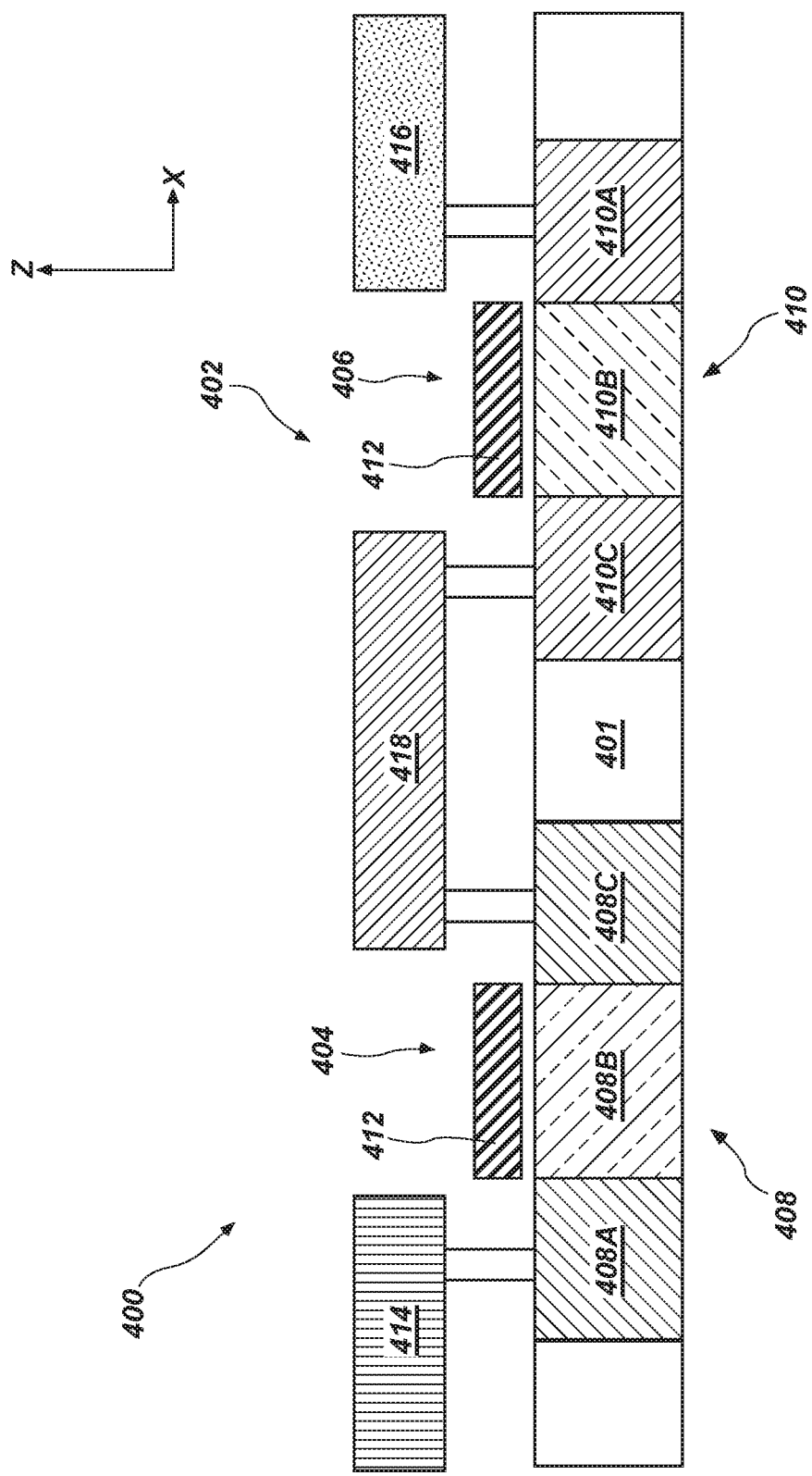
FIG. 4A through 4C are a simplified cross-sectional view of different CMOS inverters including horizontal transistors laterally displaced from one another, in accordance with additional embodiments of the disclosure.
Figure 4B:
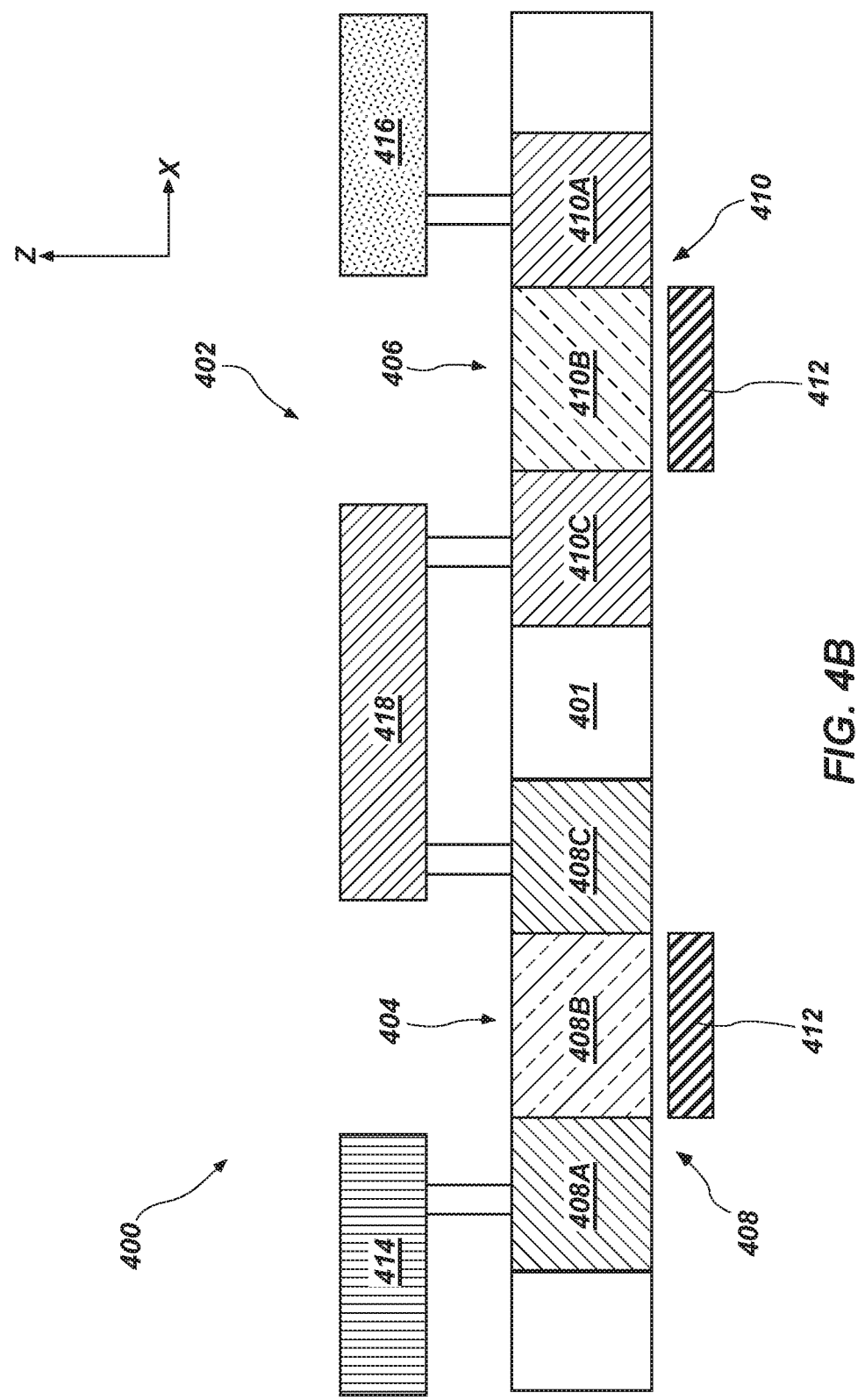
Figure 4C:
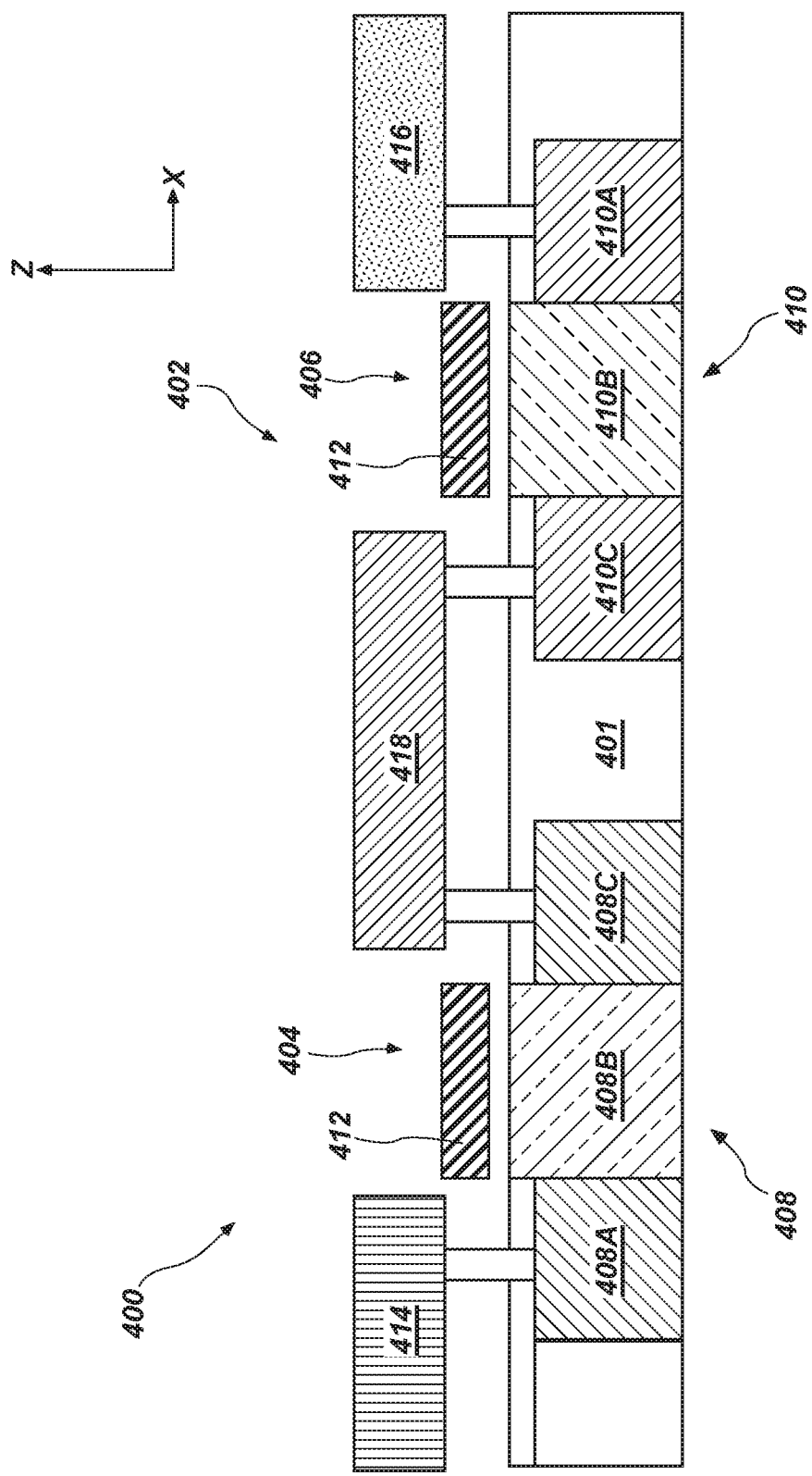
Figure 5:
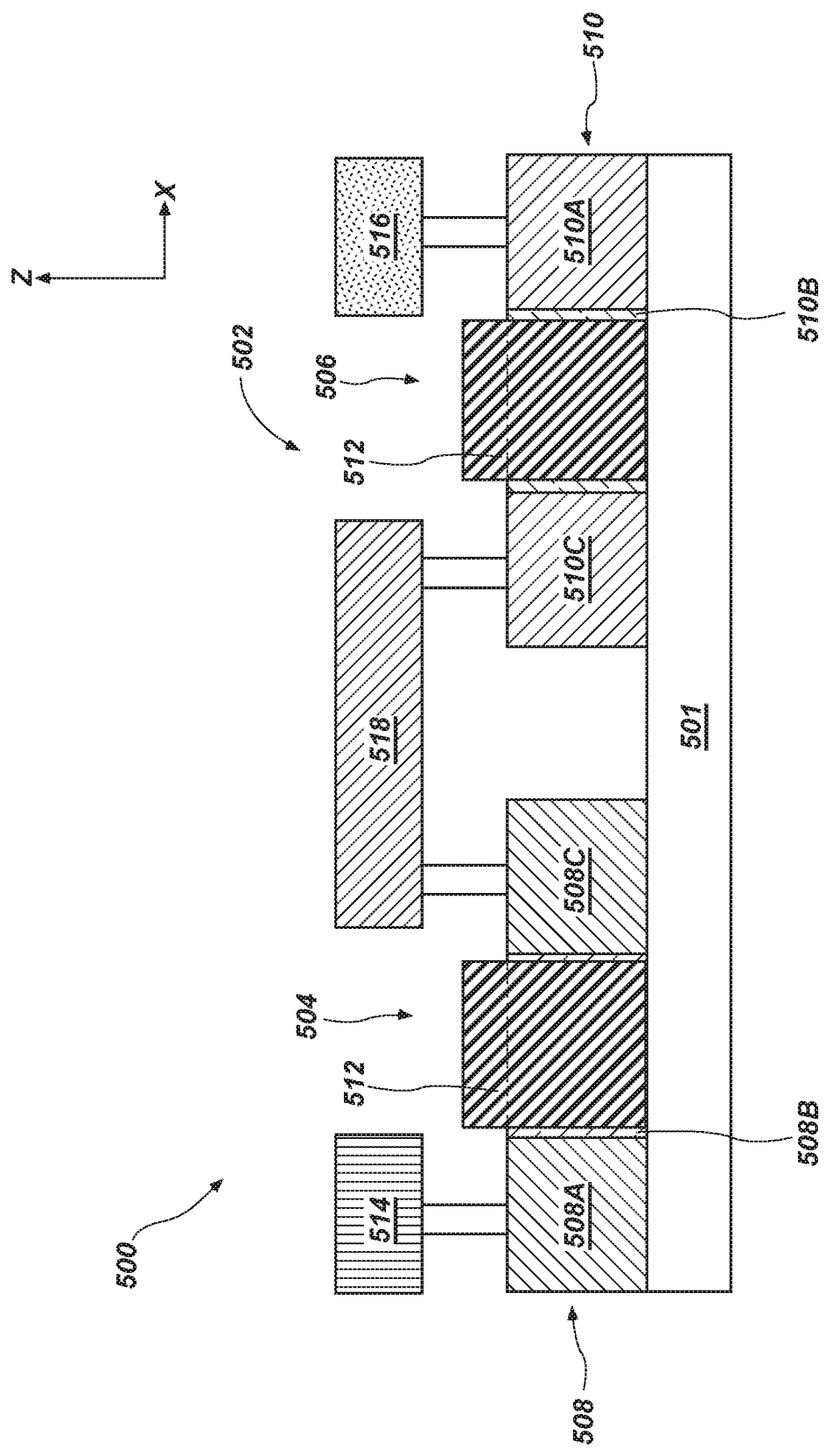
FIG. 5 is simplified cross-sectional view of a CMOS inverter including FinFETs laterally displaced from one another, in accordance with further embodiments of the disclosure.

FIGS. 4A through 5 (including FIGS. 4A, 4B, 4C, and 5) show simplified cross-sectional views of additional TFT CMOS devices according to embodiments of the disclosure that may be included in TFT control logic levels (e.g., the TFT control logic level 200 shown in FIG. 2; one or more of the first TFT control logic level 106A, the second TFT control logic level 108A, and the third TFT control logic level 110A shown in FIG. 1) of the disclosure. Throughout FIGS. 4A through 5 and the written description associated therewith, functionally similar features (e.g., structures) are referred to with similar reference numerals incremented by 100. To avoid repetition, not all features shown in FIGS. 4A through 5 are described in detail herein. Rather, unless described otherwise below, throughout FIGS. 4A through 5 (and the written description associated therewith), a feature designated by a reference numeral that is a 100 increment of the reference numeral of a previously-described feature (whether the previously-described feature is first described before the present paragraph, or is first described after the present paragraph) will be understood to be substantially similar to the previously-described feature.

FIG. 4A shows a simplified cross-sectional view of a CMOS inverter 400, in accordance with additional embodiments of the disclosure. The CMOS inverter 400 includes a CMOS circuit 402 comprising a horizontal NMOS transistor 404, and a horizontal PMOS transistor 406 horizontally (e.g., laterally) displaced from the horizontal NMOS transistor 404. The horizontal NMOS transistor 404 comprises a first semiconductive section 408 of a semiconductive structure 401, wherein the first semiconductive section 408 includes an N-type source region 408A, an N-type drain region 408C, and a P-type channel region 408B laterally (e.g., horizontally) between the N-type source region 408A and the N-type drain region 408C. The horizontal PMOS transistor 406 includes a second semiconductive section 410 of the semiconductive structure 401, the second semiconductive section 410 including a P-type source region 410A, a P-type drain region 410C, and an N-type channel region 410B laterally between the P-type source region 310A and the P-type drain region 310C. The horizontal NMOS transistor 404 and the horizontal PMOS transistor 406 of the CMOS circuit 402 also include gate electrodes 412 vertically adjacent the respective channel regions (e.g., the P-type channel region 408B, the N-type channel region 410B) thereof. In addition, the CMOS inverter 400 includes a ground (GND) structure 414 connected to the N-type source region 408A of the horizontal NMOS transistor 404; a supply voltage ($V_{cc}$) structure 416 connected to the P-type source region 410A of the horizontal PMOS transistor 406; an output structure 418 connected to the N-type drain region 408C of the horizontal NMOS transistor 404 and the P-type drain region 410C of the horizontal PMOS transistor 406; and an input structure connected to each of the gate electrodes 412.

As shown in FIG. 4A, in some embodiments, the gate electrodes 412 vertically overlie the P-type channel region 408B of the horizontal NMOS transistor 404 and the N-type channel region 410B of the horizontal PMOS transistor 406, such that the horizontal NMOS transistor 404 and the horizontal PMOS transistor 406 of the CMOS circuit 402 each exhibit a "top-gate" configuration. In additional embodiments, one or more of the horizontal NMOS transistor 404 and the horizontal PMOS transistor 406 of the CMOS circuit 402 exhibit(s) a different gate configuration than that depicted in FIG. 4A. At least one (e.g., each) of the horizontal NMOS transistor 404 and the horizontal PMOS transistor 406 may, for example, exhibit a gate configuration other than a "top-gate" configuration. As a non-limiting example, in accordance with additional embodiments of the disclosure, FIG. 4B shows a simplified cross-sectional view of the CMOS inverter 400 wherein the horizontal NMOS transistor 404 and the horizontal PMOS transistor 406 of the CMOS circuit 402 each exhibit a "bottom-gate" configuration. As shown in FIG. 4B, the gate electrodes 412 vertically underlie the P-type channel region 408B of the horizontal NMOS transistor 404 and the N-type channel region 410B of the horizontal PMOS transistor 406.

With returned reference to FIG. 4A, the semiconductive structure 401 may be formed of and include at least one semiconductive material, such as one or more of silicon (e.g., amorphous silicon, polysilicon), silicon-germanium, germanium, gallium arsenide, gallium nitride, and indium phosphide. The horizontal NMOS transistor 404 and the horizontal PMOS transistor 406 may be at least partially (e.g., substantially) located within the semiconductive structure 401. The material compositions of the horizontal NMOS transistor 404 (including the material compositions of the N-type source region 408A, the N-type drain region 408C, and the P-type channel region 408B thereof) and the horizontal PMOS transistor 406 (including the material compositions of the P-type source region 410A, the P-type drain region 410C, and the N-type channel region 410B thereof) may respectively be substantially similar to those of the vertical NMOS transistor 304 (including the material compositions of the N-type source region 308A, the N-type drain region 308C, and the P-type channel region 308B thereof) and the vertical PMOS transistor 306 (including the material compositions of the P-type source region 310A, the P-type drain region 310C, and the N-type channel region 310B thereof) previously described with reference to FIG. 3A.

As shown in FIG. 4A, vertical boundaries of the different regions (e.g., the N-type source region 408A, the N-type drain region 408C, the P-type channel region 408B) of the horizontal NMOS transistor 404 may be substantially coplanar with one another; and vertical boundaries of the different regions (e.g., the P-type source region 410A, the P-type drain region 410C, the N-type channel region 410B) of the horizontal PMOS transistor 406 may also be substantially coplanar with one another. In additional embodiments, vertical boundaries of at least one of the different regions (e.g., the P-type channel region 408B) of the horizontal NMOS transistor 404 may be offset from vertical boundaries of at least one other of the different regions (the N-type source region 408A, the N-type drain region 408C) of the horizontal NMOS transistor 404; and/or vertical boundaries of at least one of the different regions (e.g., the N-type channel region 410B) of the horizontal PMOS transistor 406 may be offset from vertical boundaries of at least one other of the different regions (the P-type source region 410A, the P-type drain region 410C) of the horizontal PMOS transistor 406. As a non-limiting example, in accordance with additional embodiments of the disclosure, FIG. 4C shows a simplified cross-sectional view of the CMOS inverter 400 wherein upper vertical boundaries of the P-type channel region 408B of the horizontal NMOS transistor 404 are offset from (e.g., vertically overlie) upper vertical boundaries of the N-type source region 408A and the N-type drain region 408C of the horizontal NMOS transistor 404; and wherein upper vertical boundaries of the N-type channel region 410B of the horizontal PMOS transistor 406 are offset from (e.g., vertically overlie) upper vertical boundaries of the P-type source region 410A and the P-type drain region 410C of the horizontal PMOS transistor 406. As shown in FIG. 4C, upper vertical boundaries of the P-type channel region 408B of the horizontal NMOS transistor 404 and the N-type channel region 410B of the horizontal PMOS transistor 406 may be substantially coplanar with uppermost vertical boundaries of the semiconductive structure 401; upper vertical boundaries of the N-type source region 408A and the N-type drain region 408C of the horizontal NMOS transistor 404 may be offset from (e.g., vertically underlie) the uppermost vertical boundaries of the semiconductive structure 401; and upper vertical boundaries of the P-type source region 410A and the P-type drain region 410C of the horizontal PMOS transistor 406 may be offset from (e.g., vertically underlie) the uppermost vertical boundaries of the semiconductive structure 401.

The GND structure 414, the $V_{cc}$ structure 416, the output structure 418, and the input structure of the CMOS inverter 400 may exhibit conventional configurations (e.g., conventional dimensions, conventional shapes, conventional conductive material compositions, conventional material distributions, conventional orientations, conventional arrangements), which are not described in detail herein.

FIG. 5 shows a simplified cross-sectional view of a CMOS inverter 500, in accordance with additional embodiments of the disclosure. The CMOS inverter 500 includes a CMOS circuit 502 comprising a NMOS FinFET 504, and a PMOS FinFET 506 horizontally (e.g., laterally) displaced from the NMOS FinFET 504. The NMOS FinFET 504 comprises a first semiconductive fin 508 including an N-type source region 508A, an N-type drain region 508C, and a P-type channel region 508B horizontally between the N-type source region 508A and the N-type drain region 508C. The PMOS FinFET 506 includes a second semiconductive fin 510 including a P-type source region 510A, a P-type drain region 510C, and an N-type channel region 510B horizontally between the P-type source region 510A and the P-type drain region 510C. The NMOS FinFET 504 and the PMOS FinFET 506 of the CMOS circuit 502 also include gate electrodes 512 adjacent (e.g., vertically adjacent, laterally adjacent) the respective channel regions (e.g., the P-type channel region 508B, the N-type channel region 510B) thereof. The NMOS FinFET 504 and the PMOS FinFET 506 of the CMOS inverter 500 may be located on or over an insulative structure 501. In addition, the CMOS inverter 500 includes a ground (GND) structure 514 connected to the N-type source region 508A of the NMOS FinFET 504; a supply voltage ($V_{cc}$) structure 516 connected to the P-type source region 510A of the PMOS FinFET 506; an output structure 518 connected to the N-type drain region 508C of the NMOS FinFET 504 and the P-type drain region 510C of the PMOS FinFET 506; and an input structure connected to each of the gate electrodes 512.

As shown in FIG. 5, one of the gate electrodes 512 may extend over opposing sides (e.g., opposing side surfaces) and a top (e.g., an upper surface) of the P-type channel region 508B of the first semiconductive fin 508 of the NMOS FinFET 504. In addition, another of the gate electrodes 512 may extend over opposing sides (e.g., opposing side surfaces) and a top (e.g., an upper surface) of the N-type channel region 510B of the second semiconductive fin 510 of the PMOS FinFET 506. In additional embodiments, one or more (e.g., each) of the NMOS FinFET 504 and the PMOS FinFET 506 exhibit(s) a "gate-all-around" configuration. For example, one of the gate electrodes 512 may substantially surround the opposing sides, the top, and a bottom of the P-type channel region 508B of the NMOS FinFET 504; and another of the gate electrodes 512 may substantially surround the opposing sides, the top, and a bottom of the N-type channel region 510B of the PMOS FinFET 506. In some such embodiments, the P-type channel region 508B of the NMOS FinFET 504 comprises one or more (e.g., multiple) P-type conductivity structures, and a conductive material of one of the gate electrodes 512 substantially surrounds surfaces of the P-type conductivity structures between the N-type source region 508A and the N-type drain region 508C; and the N-type channel region 510B of the PMOS FinFET 506 comprises one or more (e.g., multiple) N-type conductivity structures, and a conductive material of another of the gate electrodes 512 substantially surrounds surfaces of the N-type conductivity structures between the P-type source region 510A and the P-type drain region 510C.

The insulative structure 501, the GND structure 514, the $V_{cc}$ structure 516, the output structure 518, the input structure, and the additional input structure of the CMOS inverter 500 may exhibit conventional configurations (e.g., conventional dimensions, conventional shapes, conventional conductive material compositions, conventional material distributions, conventional orientations, conventional arrangements), which are not described in detail herein.

While FIGS. 3A through 5 (including FIGS. 3A, 3B, 3C, 4A, 4B, 4C, and 5) show non-limiting examples of different CMOS inverters that may be included in one or more components of at least one of the TFT control logic levels (e.g., the first TFT control logic level 106A, the second TFT control logic level 108A, the third TFT control logic level 110A) of one or more of the decks 104 (e.g., the first deck 106, the second deck 108, the third deck 110) of the stack structure 103 previously described with reference to FIG. 1, one or more components of at least one of the TFT control logic levels may include other devices (e.g., other CMOS devices) in addition to or in place of the CMOS inverters previously described with reference to FIGS. 3A through 5. By way of non-limiting example, one or more components of at least one of the TFT control logic levels of one or more of the decks 104 (FIG. 1) of the semiconductor device 100 (FIG. 1) may include one of more of other inverters (e.g., other CMOS inverters, such as balanced CMOS inverters), transmission pass gates (e.g., CMOS transmission pass gates, such as balanced CMOS transmission pass gates), ring oscillators, and negative-AND (NAND) gates (e.g., two-input NAND gates, such as balanced two-input NAND gates).

Thus, a memory device in accordance with embodiments of the disclosure comprises a base control logic structure comprising control logic devices, and a stack structure in electrical communication with the base control logic structure. The stack structure comprises decks each comprising a memory element level comprising memory elements, and a control logic level in electrical communication with the memory element level. The control logic level comprises additional control logic devices selected from the group comprising decoders, sense amplifiers, word line drivers, repair devices, memory test devices, multiplexers, error checking and correction devices, and self-refresh/wear leveling devices. At least one of the additional control logic devices comprises a circuit comprising neighboring, laterally-displaced transistors having different channel conductivities than one another.

Figure 6:
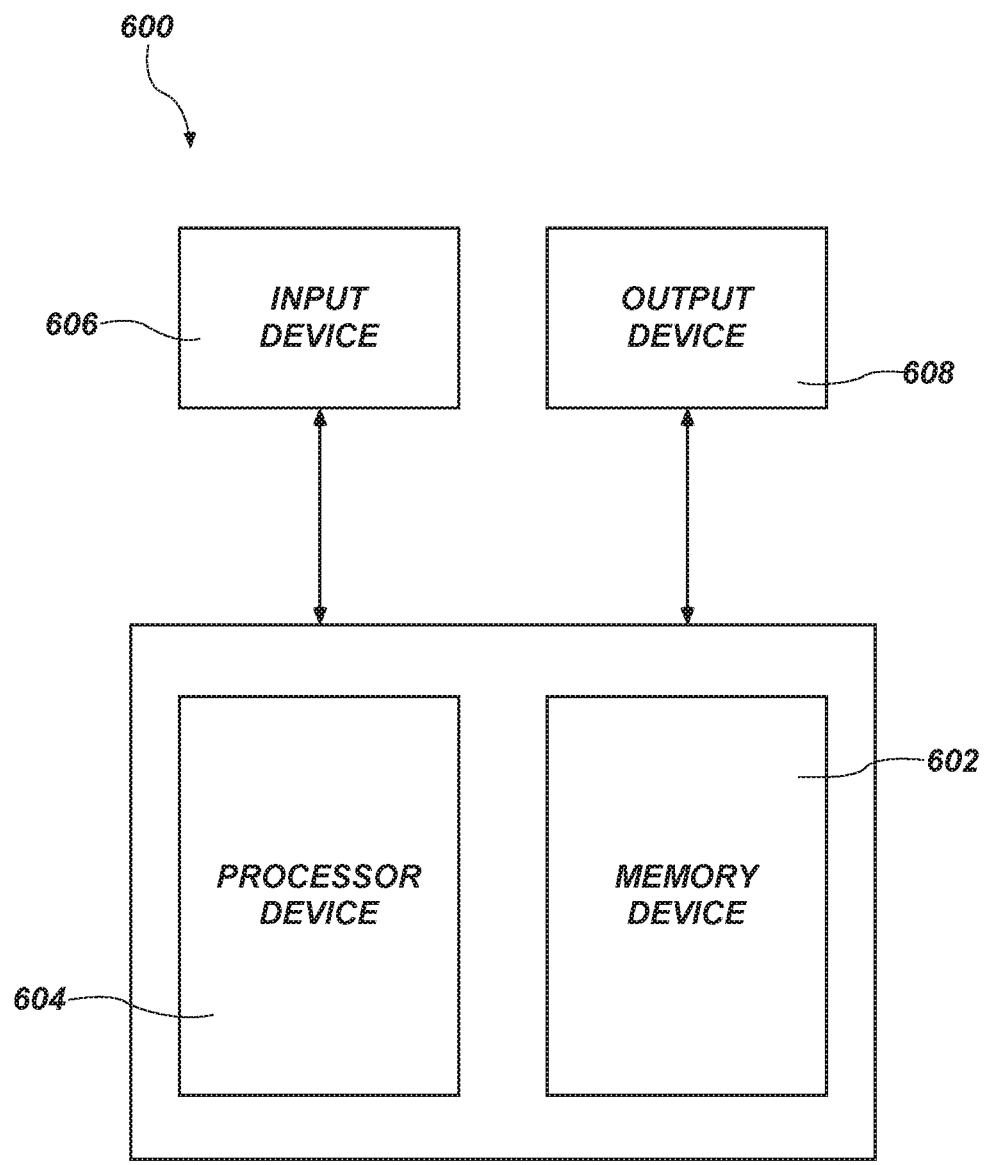
FIG. 6 is a schematic block diagram illustrating an electronic system, in accordance with embodiments of the disclosure.

Semiconductor devices (e.g., the semiconductor device 100 previous described with reference to FIG. 1) including semiconductor device structures (e.g., the stack structure 103 and the base control logic structure 102 previous described with reference to FIG. 1) in accordance with embodiments of the disclosure may be used in embodiments of electronic systems of the disclosure. For example, FIG. 6 is a block diagram of an illustrative electronic system 600 according to embodiments of disclosure. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 600 includes at least one memory device 602. The at least one memory device 602 may include, for example, an embodiment of a semiconductor device previously described herein (e.g., semiconductor device 100 previously previous described with reference to FIG. 1), wherein different decks (e.g., the decks 104) of a stack structure (e.g., the stack structure 103) of the semiconductor device each include a control logic level (e.g., the TFT control logic level 200 previously described with reference to FIG. 2) comprising an assembly of control logic devices, at least one of the control logic devices including at least one device (e.g., a TFT CMOS device) exhibiting laterally-displaced transistors (e.g., laterally-displaced vertical transistors, laterally-displaced horizontal transistors, laterally-displaced FinFETs). The electronic system 600 may further include at least one electronic signal processor device 604 (often referred to as a "microprocessor"). The electronic signal processor device 604 may, optionally, include an embodiment of a semiconductor device previously described herein (e.g., semiconductor device 100 previously previous described with reference to FIG. 1). The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, a monitor, a display, a printer, an audio output jack, a speaker, etc. In some embodiments, the input device 606 and the output device 608 may comprise a single touchscreen device that can be used both to input information to the electronic system 600 and to output visual information to a user. The one or more input devices 606 and output devices 608 may communicate electrically with at least one of the memory device 602 and the electronic signal processor device 604.

Thus, in accordance with embodiments of the disclosure, an electronic system comprises a semiconductor device comprising a stack structure. The stack structure comprises decks each comprising a memory element level comprising memory elements and a control logic level in electrical communication with the memory element level and comprising control logic devices. At least one of the control logic devices of the control logic level of one or more of the decks comprises at least one device exhibiting laterally-displaced transistors.

The devices, structures, assemblies, systems, and methods of the disclosure advantageously facilitate improved semiconductor device performance, reduced costs (e.g., manufacturing costs, material costs), increased miniaturization of components, and greater packaging density as compared to conventional devices, conventional structures, conventional assemblies, conventional systems, and conventional methods. The devices, structures, assemblies, systems, and methods of the disclosure may also improve performance, scalability, efficiency, and simplicity as compared to conventional devices, conventional structures, conventional assemblies, conventional systems, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A device, comprising:
   a control logic level comprising control logic devices comprising horizontally neighboring transistors;
   memory cells vertically overlying and in electrical communication with the control logic devices of the control logic level;
   an additional control logic level vertically overlying the memory cells and comprising additional control logic devices comprising additional horizontally neighboring transistors; and
   additional memory cells vertically overlying and in electrical communication with the additional control logic devices of the additional control logic level; and
   a base control logic structure underlying the control logic level and comprising further control logic devices having different configurations and operational functions than the control logic devices and the additional control logic devices, the further control logic devices in electrical communication with and shared by each of the control logic level and the additional control logic level.

2. The device of claim 1, wherein the control logic devices of the control logic level and the additional control logic devices of the additional control logic level comprise one or more of decoders, sense amplifiers, word line drivers, repair circuitry, I/O devices, test devices, array multiplexers, error checking and correction devices, and self-refresh/wear leveling devices.

3. The device of claim 1, wherein the further control logic devices comprise one or more of charge pumps, delay-locked loop circuitry, and drain supply voltage regulators.

4. The device of claim 1, wherein the horizontally neighboring transistors of at least one of the control logic devices comprise:
   at least one PMOS transistor; and
   at least one NMOS transistor horizontally neighboring the at least one PMOS transistor.

5. The device of claim 1, wherein:
one or more of the control logic devices of the control logic level comprise a CMOS circuit; and
one or more of the additional control logic devices of the additional control logic level comprise an additional CMOS circuit.

6. The device of claim 1, wherein the horizontally neighboring transistors of at least one of the control logic devices comprise vertical transistors horizontally neighboring one another.

7. The device of claim 1, wherein the horizontally neighboring transistors of at least one of the control logic devices comprise horizontal transistors horizontally neighboring one another.

8. The device of claim 1, wherein one or more of at least one of the horizontally neighboring transistors and at least one of the additional horizontally neighboring transistors has a hollow-channel configuration.

9. The device of claim 1, wherein the base control logic structure comprises one or more of a controller, a host, and a global I/O device in electrical communication with and shared by each of the control logic level and the additional control logic level.

10. A device, comprising:
a control logic level comprising control logic devices comprising horizontally neighboring transistors;
memory cells vertically overlying and in electrical communication with the control logic devices of the control logic level;
an additional control logic level vertically overlying the memory cells and comprising additional control logic devices comprising additional horizontally neighboring transistors; and
additional memory cells vertically overlying and in electrical communication with the additional control logic devices of the additional control logic level;
wherein one or more of at least one of the horizontally neighboring transistors and at least one of the additional horizontally neighboring transistors comprises:
a channel thickness in a first horizontal direction within a range of from about 10 nm to about 50 nm;
a channel width in a second horizontal direction perpendicular to the first horizontal direction within a range of from about 20 nm to about 200 nm; and
a channel length in a vertical direction within a range of from about 50 nm to about 200 nm.

11. A memory device, comprising:
a first array of memory cells, each memory cell of the first array of memory cells individually comprising:
a first memory element; and
a first select device in electrical communication with the first memory element;
a first control logic level comprising CMOS circuits in electrical communication with the first array of memory cells;
a second array of memory cells overlying the first array of memory cells, each memory cell of the second array of memory cells individually comprising:
a second memory element; and
a second select device in electrical communication with the second memory element; and
a second control logic level comprising additional CMOS circuits in electrical communication with the second array of memory cells; and
a base control logic level underlying the first control logic level and comprising devices configured to provide operational functions for each of the first array of memory cells, the first control logic level, the second array of memory cells, and the second control logic level.

12. The memory device of claim 11, wherein:
the first control logic level underlies the first array of memory cells; and
the second control logic level intervenes between the first array of memory cells and the second array of memory cells.

13. The memory device of claim 11, further comprising:
a third array of memory cells overlying the second array of memory cells, each memory cell of the third array of memory cells individually comprising:
a third memory element; and
a third select device in electrical communication with the third memory element; and
a third control logic level comprising further CMOS circuits in electrical communication with the third array of memory cells.

14. The memory device of claim 13, wherein the third control logic level intervenes between the second array of memory cells and the third array of memory cells.

15. The memory device of claim 11, wherein the CMOS circuits of the first control logic level and the additional CMOS circuits of the second control logic level comprise transistors each individually comprising:
a source region;
a drain region;
a channel region vertically interposed between the source region and the drain region; and
at least one conductive gate structure horizontally neighboring the channel region.

16. The memory device of claim 11, wherein the CMOS circuits of the first control logic level and the additional CMOS circuits of the second control logic level comprise transistors each individually comprising:
a source region;
a drain region;
a channel region horizontally interposed between the source region and the drain region; and
at least one conductive gate structure vertically neighboring the channel region.

17. The memory device of claim 11, further comprising a base control logic level underlying the first control logic level and in electrical communication with the first array of memory cells and the second array of memory cells.

18. An electronic system, comprising:
an input device;
an output device;
a processor device operably coupled to the input device and the output device; and
a memory device operably coupled to the processor device and comprising a stack structure comprising:
a base control logic structure comprising control logic devices;
a control logic level overlying the base control logic structure and including CMOS devices in electrical communication with the control logic devices of the base control logic structure, the CMOS devices comprising transistors horizontally neighboring one another;
an array of memory cells in electrical communication with the control logic level;
an additional control logic level overlying the control logic level and including additional CMOS devices in electrical communication with the control logic devices of the base control logic structure, the additional CMOS devices comprising additional transistors horizontally neighboring one another; and an additional array of memory cells in electrical communication with the additional control logic level.

\* \* \* \* \*

UNITED STATES PATENT AND TRADEMARK OFFICE
CERTIFICATE OF CORRECTION

PATENT NO. : 11,063,037 B2
APPLICATION NO. : 16/737472
DATED : July 13, 2021
INVENTOR(S) : Scott E. Sills and Kurt D. Beigel It is certified that error appears in the above-identified patent and that said Letters Patent is hereby corrected as shown below:

In the Specification
        Column 15,    Line 4,    change "Jim," to --nm,--

In the Claims
    Claim 1,    Column 20,    Line 40,    delete "and"
    Claim 11,    Column 21,    Line 62,    delete "and"

Signed and Sealed this
Twenty-fourth Day of August, 2021

Drew Hirshfeld
*Performing the Functions and Duties of the
Under Secretary of Commerce for Intellectual Property and
Director of the United States Patent and Trademark Office*